United States Patent
Mawatari (10) Patent No.: US 9,943,020 B2
(45) Date of Patent: Apr. 10, 2018

(54) COMPONENT MOUNTING APPARATUS AND COMPONENT MOUNTING METHOD

(71) Applicant: PANASONIC INTELLECTUAL PROPERTY MANAGEMENT CO., LTD., Osaka (JP)

(72) Inventor: Michiaki Mawatari, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 236 days.

(21) Appl. No.: 14/835,784

(22) Filed: Aug. 26, 2015

(65) Prior Publication Data

US 2016/0081242 A1 Mar. 17, 2016

(30) Foreign Application Priority Data

Sep. 17, 2014 (JP) ................................ 2014-188972

(51) Int. Cl.
*H05K 13/04* (2006.01)
*H05K 13/00* (2006.01)
*H05K 13/08* (2006.01)

(52) U.S. Cl.
CPC ..... *H05K 13/0495* (2013.01); *H05K 13/0061* (2013.01); *H05K 13/08* (2013.01); *Y10T 29/53174* (2015.01); *Y10T 29/53313* (2015.01)

(58) Field of Classification Search
CPC ............... H05K 13/04; H05K 13/0404; H05K 13/0408; H05K 13/0417; H05K 13/08; H05K 3/0097; H05K 13/0061; H05K 13/0541; H05K 13/0495; Y10T 29/53174; Y10T 29/53178; Y10T 29/53261;
(Continued)

(56) References Cited

U.S. PATENT DOCUMENTS

2010/0064511 A1* 3/2010 Maenishi ........... H05K 13/0408
29/832
2010/0325860 A1* 12/2010 Maenishi ............... H05K 13/08
29/407.01
(Continued)

FOREIGN PATENT DOCUMENTS

JP 2012-059798 A 3/2012

*Primary Examiner* — A. Dexter Tugbang
*Assistant Examiner* — Joshua D Anderson
(74) *Attorney, Agent, or Firm* — Pearne & Gordon LLP (57) ABSTRACT

A component mounting apparatus includes transport mechanisms that transport boards, component supply sections, mounting heads, and a control unit that controls them based on mounting data. Each transport mechanism includes an upstream side operation area and a downstream side operation area. When the mounting data corresponds to an independent mounting mode in which each of the mounting heads is used to mount a component only onto a board on a corresponding mechanism, the control unit performs a control so that the upstream side operation area is used as a mounting area. When the mounting data corresponds to an alternating mounting mode in which both mounting heads are used to mount the components sequentially onto a board that is first carried into the downstream side operation area, the control unit performs a control so that the upstream side operation area is used as a standby area.

4 Claims, 7 Drawing Sheets

(58) Field of Classification Search
CPC ......... Y10T 29/53265; Y10T 29/53313; Y10T 29/53539; Y10T 29/53543; Y10T 29/4913
USPC ......... 29/739, 740, 757, 760, 771, 822, 823, 29/832
See application file for complete search history.

(56) References Cited

U.S. PATENT DOCUMENTS

| | | | |
|---|---|---|---|
| 2012/0240388 A1* | 9/2012 | Ishimoto | H05K 13/0452 29/593 |
| 2013/0047427 A1* | 2/2013 | Yagi | H05K 13/0434 29/832 |
| 2013/0247368 A1* | 9/2013 | Kawase | H05K 13/0452 29/832 |

* cited by examiner

COMPONENT MOUNTING APPARATUS AND COMPONENT MOUNTING METHOD

CROSS-REFERENCES TO RELATED APPLICATION(S)

This application is based on and claims priority from Japanese Patent Application No. 2014-188972 filed on Sep. 17, 2014, the entire contents of which are incorporated herein by reference.

BACKGROUND

1. Field of the Invention

The present invention relates to a component mounting apparatus and a component mounting method for mounting a component onto a board.

2. Description of Related Art

In a component mounting apparatus that mounts a component onto a board to manufacture a component-mounted board, a board transport mechanism for transporting a board from an upstream side to a downstream side is provided. In the component mounting apparatus, a component mounting operation of transferring and mounting a component picked up from a component supply section by a component mounting mechanism with respect to a board transported by the board transport mechanism and positioned and held at a predetermined mounting operation position (mounting area) is executed. In order to efficiently execute the board transport and the component mounting operation, component mounting apparatuses having various configurations have been used in the related art (for example, see Patent Literature 1).

In the related component mounting apparatus disclosed in JP-A-2012-59798 as Patent Literature 1, two transport lanes are arranged in parallel as board transport mechanisms, and two component supply sections that are provided on lateral sides of the board transport mechanisms and two mounting heads which are component mounting mechanisms are provided. Further, independent mounting in which each mounting head is independently provided to execute a component mounting operation only for the transport lane corresponding to the mounting head, and alternating mounting in which the opposite transport lane is also included in an operation target range and a component mounting operation is alternately executed by two mounting heads for one board are appropriately selected and executed.

Further, two operation areas on an upstream side and a downstream side are respectively provided in a mounting area of each transport lane where the component mounting operation is performed by the mounting head, and a board is carried into each operation area so that the component mounting operation is executed. According to this configuration, while the component mounting operation is being executed in one operation area, it is possible to perform board transport for the other operation area, and it is possible to prevent generation of a standby time when the component mounting operation is stopped for the board transport. For example, in the independent mounting operation, when only one mounting area is present for each transport lane, a standby time for carrying the next board therein is generated every time after the component mounting operation, but in the above-mentioned configuration, the component mounting operation is performed in the upstream side operation area subsequent to the component mounting operation in the downstream side operation area, and thus, the standby time for carrying the board can be reduced.

Patent Literature 1: JP-A-2012-59798

SUMMARY

However, in the component mounting apparatus disclosed in JP-A-2012-59798, since the component mounting operation is executed in both the upstream side operation area and the downstream side operation area regardless of production modes such as the independent mounting or the alternating mounting, the following problems occur. That is, in the alternating mounting, when the component mounting operation of one transport lane among two transport lanes is finished in the downstream side operation area, the component mounting operation is performed in the downstream side operation area of the other transport lane. Further, when the component mounting operation is finished in the downstream side operation area of the other transport lane, the component mounting operation is performed in the upstream side operation area of one transport lane.

In the downstream side operation area of one transport lane, when the component mounting operation is finished, the board is carried out therefrom. Thus, even though a board can be carried into the downstream side operation area of one transport lane from the upstream side operation area of the one transport lane during the component mounting operation in the downstream side operation area of the other transport lane, when the component mounting operation in the downstream side operation area of the other transport lane is finished, the component mounting operation in the upstream side operation area of one transport lane is performed. As a result, the downstream side operation area is not effectively used, thereby lowering productivity.

Accordingly, a non-limited object of one or more embodiments of the present invention is to provide a component mounting apparatus that includes plural transport lanes, plural mounting heads, and plural operation areas and is capable of suppressing reduction in productivity due to production modes, and a component mounting method using the same.

A first aspect of the present invention provides a component mounting apparatus including: a first transport mechanism that transports a first board in a board transport direction; a second transport mechanism that is arranged in parallel with the first transport mechanism and transports a second board in the board transport direction; a first component supply section that is disposed on a lateral side of the first transport mechanism; a second component supply section that is disposed on a lateral side of the second transport mechanism; a first mounting head that is configured to pick up a component supplied from the first component supply section and mount the component onto the first board and the second board; a second mounting head that is configured to pick up a component supplied from the second component supply section and mount the component onto the first board and the second board; and a control unit that controls the first transport mechanism, the second transport mechanism, the first component supply section, the second component supply section, the first mounting head, and the second mounting head based on mounting data, wherein each of the first transport mechanism and the second transport mechanism includes an upstream side operation area where an upstream side board holding part for positioning and holding the first board or the second board is provided, and a downstream side operation area where a downstream side board holding part that is provided on a downstream side in the board transport direction with reference to the upstream side operation area for positioning and holding the first board or the second board is provided, and wherein when the mounting data corresponds to an independent mounting mode in which the first mounting head is used to mount the component only onto the first board and the second mounting head is used to mount the component only onto the second board, the control unit performs a control so that the upstream side operation area is used as a mounting area where a component is mounted onto a board that is positioned and held by the upstream side board holding part, and when the mounting data corresponds to an alternating mounting mode in which both of the first mounting head and the second mounting head are used to mount the components sequentially onto a board that is first carried into the downstream side operation area among the first board and the second board, the control unit performs a control so that the upstream side operation area is used as a standby area where a board to be carried to the downstream side operation area temporarily waits.

A second aspect of the present invention provides a component mounting method for mounting a component onto a board by a component mounting apparatus that includes a first transport mechanism that transports a first board in a board transport direction, a second transport mechanism that is arranged in parallel with the first transport mechanism and transports a second board in the board transport direction, a first component supply section that is disposed on a lateral side of the first transport mechanism, a second component supply section that is disposed on a lateral side of the second transport mechanism, a first mounting head that is configured to pick up a component supplied from the first component supply section and mount the component onto the first board and the second board, and a second mounting head that is configured to pick up a component supplied from the second component supply section and mount the component onto the first board and the second board, and controls the first transport mechanism, the second transport mechanism, the first component supply section, the second component supply section, the first mounting head, and the second mounting head based on mounting data, wherein each of the first transport mechanism and the second transport mechanism includes an upstream side operation area where an upstream side board holding part for positioning and holding the first board or the second board is provided, and a downstream side operation area where a downstream side board holding part that is provided on a downstream side in the board transport direction with reference to the upstream side operation area for positioning and holding the first board or the second board is provided, the method including: determining whether the mounting data corresponds to an independent mounting mode for executing independent mounting in which the first mounting head is used to mount the component only onto the first board and the second mounting head is used to mount the component only onto the second board, or an alternating mounting mode for executing alternating mounting in which both of the first mounting head and the second mounting head are used to mount the components sequentially onto a board that is first carried into the downstream side operation area among the first board and the second board, executing the independent mounting using the upstream side operation area as a mounting area where a component is mounted onto a board that is positioned and held by the upstream side board holding part when it is determined that the mounting data corresponds to the independent mounting mode; and executing the alternating mounting using the upstream side operation area as a standby area where a board carried to the downstream side operation area temporarily waits when it is determined that the mounting data corresponds to the alternating mounting mode.

According to the aspects of the present invention, it may be possible to realize a component mounting apparatus that includes plural transport lanes, plural mounting heads, and plural operation areas and is capable of suppressing reduction in productivity due to production modes, and a component mounting method using the same.

DETAILED DESCRIPTION

Figure 1:
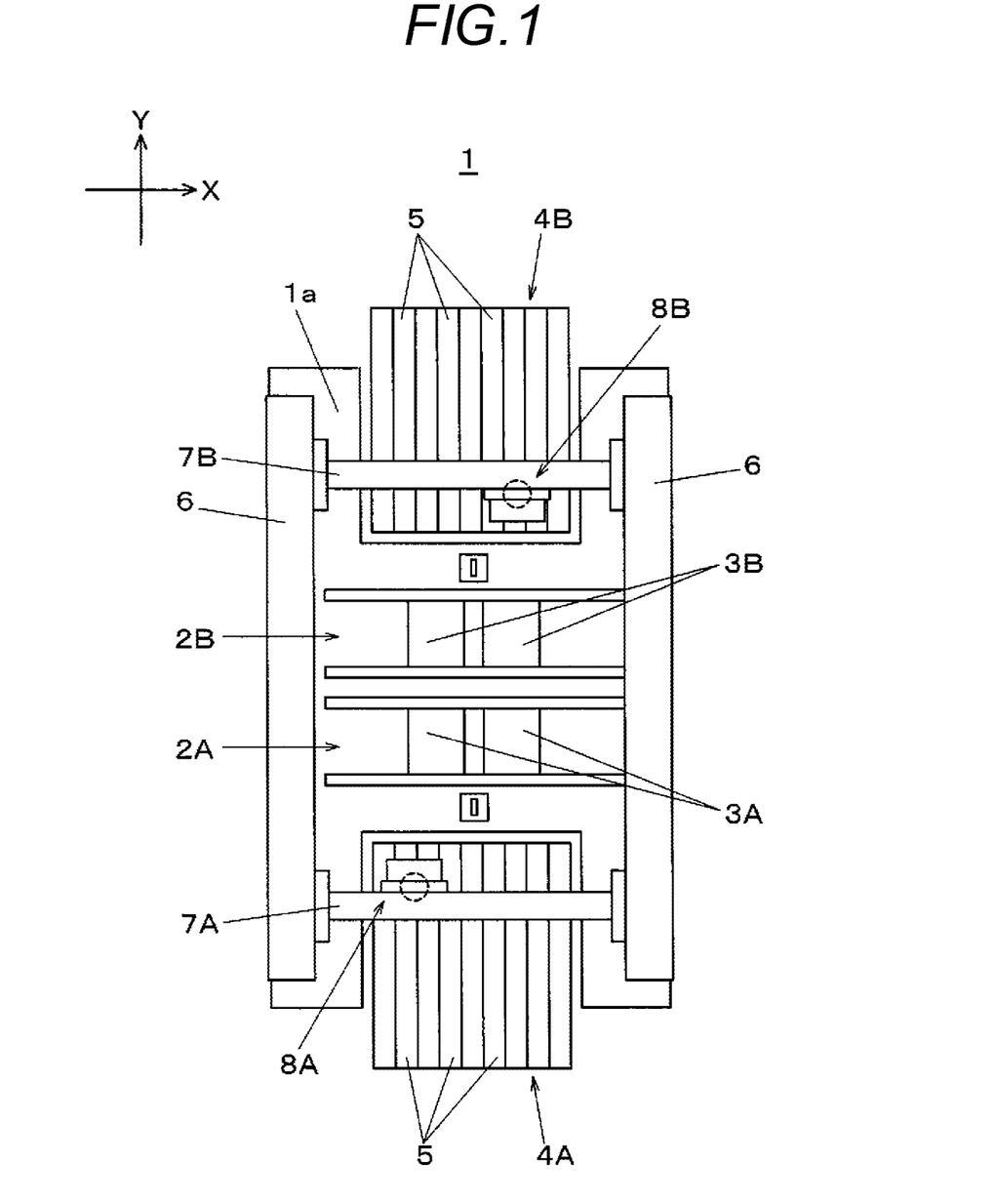
FIG. 1 is a plan view of a component mounting apparatus according to an embodiment of the present invention.

First, a configuration of a component mounting apparatus 1 according to an embodiment of the present invention will be described with reference to FIG. 1. The component mounting apparatus 1 has a function of mounting a component onto a board. Hereinafter, a board transport direction of the board is defined as an X direction, and a direction orthogonal to the X direction in the horizontal plane is defined as a Y direction. Further, a left side on the paper in FIG. 1 is referred to as an upstream side, and a right side on the paper is referred to as a downstream side.

In a central portion of a base 1a, a first transport lane 2A which is a first transport mechanism that extends in the X direction and a second transport lane 2B which is a second transport mechanism are provided in a state of being arranged in parallel in the Y direction. The first transport lane 2A has a function of transporting a first board 3A received from an upstream side device to be positioned at a predetermined mounting operation position (position of the first board 3A indicated by a solid line). The second transport lane 2B has a function of transporting a second board 3B received from an upstream side device to be positioned at a predetermined mounting operation position (position of the second board 3B indicated by a solid line).

For ease of description, the first transport lane 2A and the second transport lane 2B are simply referred to as "transport lanes 2A and 2B", and the first board 3A and the second board 3B are simply referred to as "boards 3A and 3B", except when it is necessary to separately describe the lanes and the boards. The transport lanes 2A and 2B have two mounting operation positions on the upstream side and the downstream side, respectively.

A first component supply section 4A and a second component supply section 4B are respectively disposed on lateral sides of the transport lanes 2A and 2B. For ease of description, the first component supply section 4A and the second component supply section 4B are simply referred to as "component supply sections 4A or 4B", except when it is necessary to separately describe the first component supply section 4A and the second component supply section 4B. Plural tape feeders 5 that are arranged in parallel in the X direction are set in the component supply sections 4A and 4B. Each tape feeder 5 pitch-feeds a component held by a carrier tape to supply the component to a pickup position using mounting heads 8A and 8B (which will be described later).

Y-axis beams 6 are provided in both ends of the base 1a in the X direction, and two X-axis beams 7A and 7B are coupled to the Y-axis beams 6 to be movable in the Y direction. A first mounting head 8A and a second mounting head 8B are mounted to the X-axis beams 7A and 7B to be movable in the X direction. For ease of description, the first mounting head 8A and the second mounting head are simply referred to as "mounting heads 8A and 8B", except when it is necessary to separately describe the first mounting head 8A and the second mounting head 8B. The Y-axis beams 6, the X-axis beams 7A and 7B form a head movement mechanism for moving the mounting heads 8A and 8B in the X direction and the Y direction.

The mounting heads 8A and 8B pick up components supplied from the component supply sections 4A and 4B, and mount the components onto the boards 3A and 3B that are positioned at the mounting operation positions, respectively. The component mounting apparatus 1 performs component mounting based on predetermined mounting modes. When the mounting mode is an independent mounting mode, an independent mounting operation of using the first mounting head 8A to mount a component only onto the first board 3A of the first transport lane 2A and using the second mounting head 8B to mount a component only onto the second board 3B of the second transport lane 2B is performed. Here, at two mounting operation positions of the respective transport lanes 2A and 2B, the component mounting is sequentially performed in the order of the downstream side, on the upstream side, on the downstream side, and so on.

When the mounting mode is an alternating mounting mode, an alternating mounting operation of using the first mounting head 8A and the second mounting head 8B to mount components onto the first board 3A and the second board 3B alternately is performed. Here, the component mounting is sequentially performed at the mounting operation positions in the order of the downstream side of the first transport lane 2A, the downstream side of the second transport lane 2B, the upstream side of the first transport lane 2A, the upstream side of the second transport lane 2B, the downstream side of the first transport lane 2A, and so on.

Figure 2:
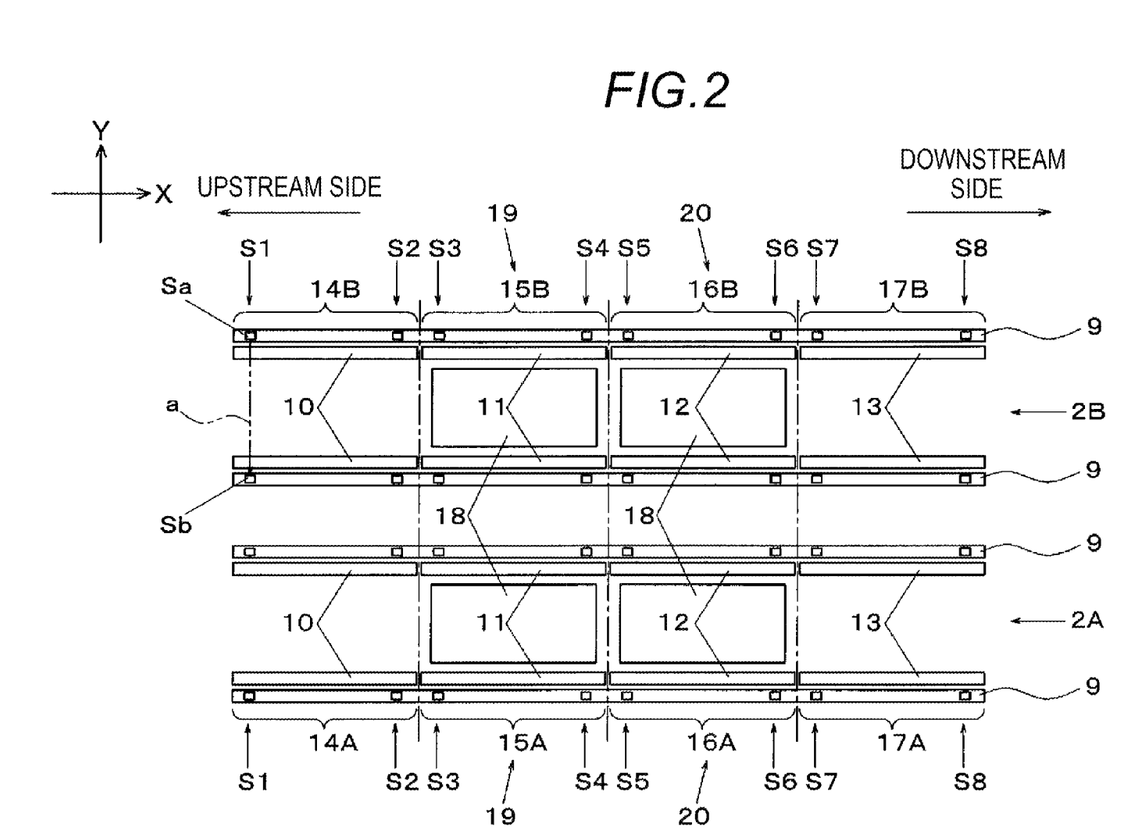
FIG. 2 is a plan view of a transport lane provided in a component mounting apparatus according to an embodiment of the present invention.

Next, the transport lanes 2A and 2B provided in the component mounting apparatus 1 will be described in detail with reference to FIG. 2. The transport lanes 2A and 2B include a pair of transport rails 9 that extends in the X direction. A conveyor mechanism including plural (here, four) conveyors is disposed inside the transport rails 9. The conveyor mechanism include a pair of carry-in conveyors 10, a pair of upstream side operation conveyors 11, a pair of downstream side operation conveyors 12, and a pair of carry-out conveyors 13 that are sequentially arranged from the upstream side.

The carry-in conveyors 10 transfer the boards 3A and 3B received from the upstream side device to the upstream side operation conveyors 11. The upstream side operation conveyors 11 and the downstream side operation conveyors 12 transport the boards 3A and 3B that are respectively received from the upstream side conveyors to be positioned at the mounting operation positions, and transfer the boards 3A and 3B on which the components are mounted to the downstream side conveyors. The carry-out conveyors 13 carry the boards 3A and 3B received from the downstream side operation conveyors 12 to a downstream side device. The conveyor mechanism may individually include a drive source to independently transport the boards 3A and 3B. Accordingly, even when the component mounting operation for the boards 3A and 3B held on the downstream side operation conveyors 12 is not finished, the upstream side operation conveyors 11 may receive the boards 3A and 3B from the carry-in conveyors 10.

In the respective transport lanes 2A and 2B, areas where the carry-in conveyors 10 are disposed correspond to carry-in areas 14A and 14B where the boards 3A and 3B received from the upstream side device enter. Further, areas where the upstream side operation conveyors 11 are disposed correspond to upstream side operation areas 15A and 15B where components are mounted onto the boards 3A and 3B received from the carry-in areas 14A and 14B. In addition, areas where the downstream side operation conveyors 12 are disposed correspond to downstream side operation areas 16A and 16B where components are mounted onto the boards 3A and 3B received from the upstream side operation areas 15A and 15B. Furthermore, areas where the carry-out conveyors 13 are disposed correspond to carry-out areas 17A and 17B where the boards 3A and 3B on which the components are mounted are carried to the downstream side device.

In the pair of transport rails 9, at positions corresponding to respective both ends of the carry-in areas 14A and 14B in the board transport direction, a pair of board detecting sensors S1 and S2 is provided to face each other. Similarly, at positions corresponding to respective both ends of the upstream side operation areas 15A and 15B, the downstream side operation areas 16A and 16B, and the carry-out areas 17A and 17B in the board transport direction, a pair of board detecting sensors S3 and S4, a pair of board detecting sensors S5 and S6, and a pair of board detecting sensors S7 and S8 are provided to face each other.

The board detecting sensors S1 to S8 are optical sensors including a light emitting section Sa and a light receiving section Sb. The light emitting section Sa emits signal light a in the Y direction toward the light receiving section Sb, and the light receiving section Sb receives the signal light a. The board detecting sensors S1 to S8 detect the presence or absence of the boards 3A and 3B according to whether the boards 3A and 3B block the signal light a. Detection results of the boards 3A and 3B from the board detecting sensors S1 to S8 are transmitted to the control section 33 (see FIG. 3), and the control section 33 controls transport of the boards 3A and 3B based on the detection results of the boards 3A and 3B. Arrangement of the light emitting section Sa and the light receiving section Sb may be exchanged.

Board holding mechanisms 18 are respectively provided in the upstream side operation areas 15A and 15B, and the downstream side operation areas 16A and 16B. The board holding mechanisms 18 clamp and hold the boards 3A and 3B positioned at the mounting operation positions in the respective areas. The board holding mechanisms 18 may individually include a drive source to independently hold the boards 3A and 3B. Accordingly, it is possible to hold only the board 3A or 3B which is a component mounting target positioned at the mounting operation position using the board holding mechanism 18 to mount the component.

In this way, when the upstream side operation areas 15A and 15B and the downstream side operation areas 16A and 16B are used as component mounting areas, the upstream side operation conveyors 11 and the downstream side operation conveyors 12 position the boards 3A and 3B which are the component mounting targets at the mounting operation positions. Further, the boards 3A and 3B positioned at the mounting operation positions are held by the board holding mechanisms 18. That is, the upstream side operation conveyors 11 and the board holding mechanisms 18 form an upstream side board holding part 19 for positioning and holding the boards 3A and 3B which are the component mounting targets.

Further, the downstream side operation conveyors 12 and the board holding mechanisms 18 form a downstream side board holding part 20 for positioning and holding the boards 3A and 3B which are the component mounting targets. When the upstream side operation areas 15A and 15B are used as standby areas where the boards 3A and 3B to be carried into the downstream side operation areas 16A and 16B temporarily wait, the board holding mechanisms 18 do not hold the boards 3A and 3B which are the targets. Thus, when the boards 3A and 3B which wait at the upstream side operation areas 15A and 15B are transported to the downstream side operation areas 16A and 16B, a release operation of the holding by means of the board holding mechanisms 18 is not necessary, which leads to reduction in a transport time.

In this way, the first transport lane 2A which is the first transport mechanism and the second transport lane 2B which is the second transport mechanism respectively have the upstream side operation areas 15A and 15B where the upstream side board holding part 19 for positioning and holding the first board 3A or the second board 3B are provided. Further, the first transport lane 2A and the second transport lane 2B respectively have the downstream side operation areas 16A and 16B where the downstream side board holding part 20 that is provided on the downstream side in the board transport direction with reference to the upstream side operation areas 15A and 15B for positioning and holding the first board 3A or the second board 3B is provided.

Figure 3:
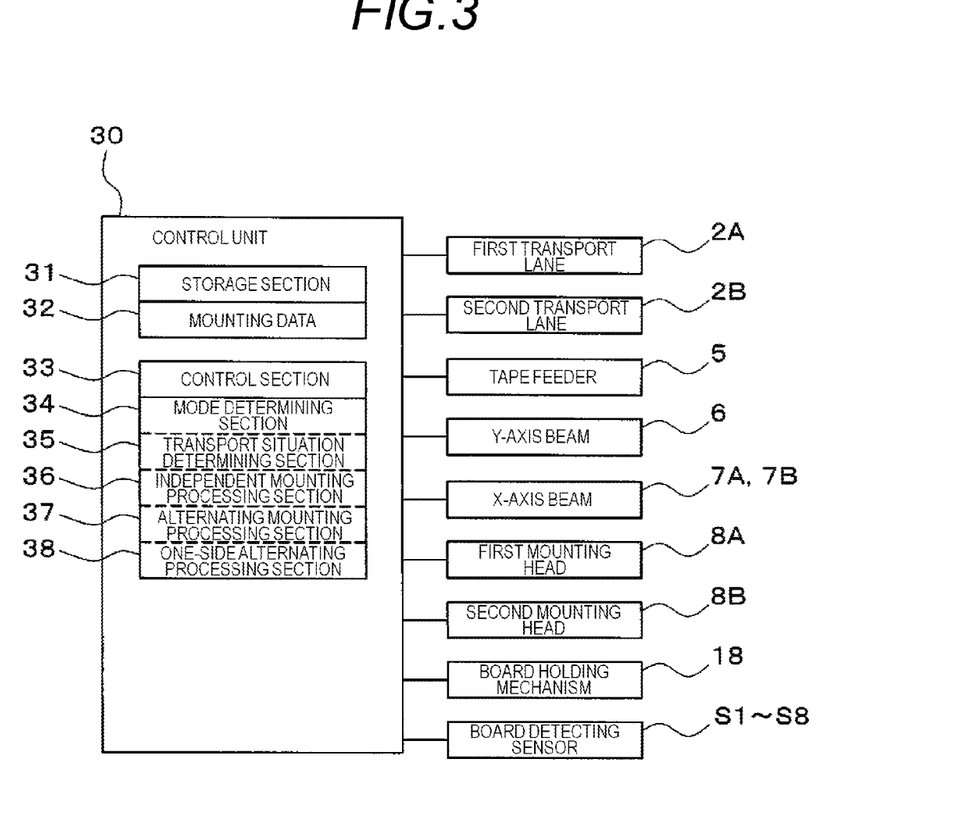
FIG. 3 is a block diagram illustrating a configuration of a control system of a component mounting apparatus according to an embodiment of the present invention.

Next, a control system of the component mounting apparatus 1 will be described with reference to FIG. 3. A control unit 30 includes a storage section 31 and a control section 33. Further, the control unit 30 is connected to the first transport lane 2A, the second transport lane 2B, the tape feeders 5, the Y-axis beams 6, the X-axis beams 7A and 7B, the first mounting head 8A, the second mounting head 8B, the board holding mechanisms 18, and the board detecting sensors S1 to S8.

The storage section 31 stores a variety of data such as mounting data 32. The mounting data 32 refers to a variety of data that is referred to in the component mounting operation, and includes information about a board size, a component type to be mounted, a component mounting position, a mounting mode to be applied (independent mounting mode, alternating mounting mode), and the like. The control section 33 controls the transport lanes 2A and 2B, the tape feeders 5, the Y-axis beams 6, the X-axis beams 7A and 7B, the mounting heads 8A and 8B, and the board holding mechanisms 18 based on the mounting data 32. Further, the control section 33 includes a mode determining section 34, a transport situation determining section 35, an independent mounting processing section 36, an alternating mounting processing section 37, and a one-side alternating mounting processing section 38.

The mode determining section 34 determines whether the component mounting with respect to the boards 3A and 3B which are component mounting targets are to be performed in the independent mounting mode or in the alternating mounting mode, based on the mounting data 32. The transport situation determining section 35 monitors detection results of the boards 3A and 3B in the respective areas from the board detecting sensors S1 to S8, operation situations of drive mechanisms of the respective conveyors of the transport lanes 2A and 2B, or the like. Further, the transport situation determining section 35 determines whether the boards 3A and 3B which are component mounting targets are present in the carry-in areas 14A and 14B, the upstream side operation areas 15A and 15B, and the downstream side operation areas 16A and 16B, that is, whether the boards 3A and 3B which are component mounting targets are present in the transport lanes 2A and 2B, based on the monitoring results.

The independent mounting processing section 36 performs a control so that components are independently mounted onto the boards 3A and 3B which are component mounting targets using both of the upstream side operation areas 15A and 15B and the downstream side operation areas 16A and 16B as mounting areas. The alternating mounting processing section 37 performs a control so that components are sequentially and alternately mounted onto the boards 3A and 3B which are component mounting targets previously transported to the downstream side operation areas 16A and 16B using the upstream side operation areas 15A and 15B as standby areas and using the downstream side operation areas 16A and 16B as mounting areas. The one-side alternating mounting processing section 38 performs a control so that components are one-side alternately mounted in the transport lanes 2A and 2B where the boards 3A and 3B which are component mounting targets are present using both of the upstream side operation areas 15A and 15B and the downstream side operation areas 16A and 16B as mounting areas.

The component mounting apparatus 1 according to an embodiment of the present invention is configured as described above. Next, a component mounting operation in a component mounting method will be described with reference to a flowchart shown in FIG. 4. First, when production is started, the mode determining section 34 determines whether the component mounting with respect to the boards 3A and 3B which are component mounting targets is to be performed in the alternating mounting mode (ST1: mode determination process). That is, in ST1, it is determined whether the mounting mode is the alternating mounting mode ("Yes") or the independent mounting mode ("No"). When the determination result is "No" in ST1, the independent mounting processing section 36 executes the component mounting operation based on the independent mounting operation using the upstream side operation areas 15A and 15B and the downstream side operation areas 16A and 16B as mounting areas (ST2: independent mounting process).

Figure 4:
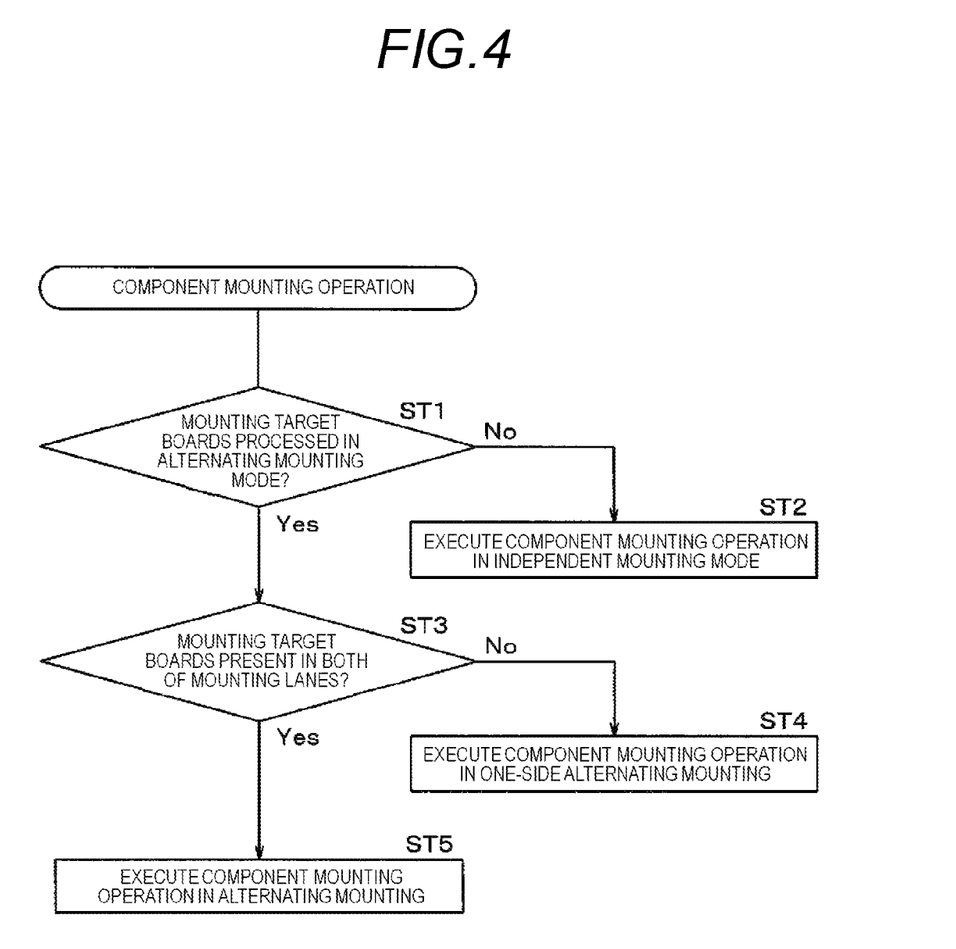
FIG. 4 is a flowchart of a component mounting operation in a component mounting apparatus according to an embodiment of the present invention.

When the determination result is "Yes" in ST1, the transport situation determining section 35 determines whether the boards 3A and 3B which are component mounting targets are present in both of the transport lanes 2A and 2B (ST3: transport situation determination process). When the determination result is "No" in ST3, that is, when the boards 3A and 3B which are component mounting targets are not present in at least one of the transport lanes 2A and 2B, the one-side alternating mounting processing section 38 executes the component mounting operation based on the one-side alternating mounting using the upstream side operation areas 15A and 15B and the downstream side operation areas 16A and 16B as mounting areas (ST4: one-side alternating mounting process).

When the determination result is "Yes" in ST3, that is, when the boards 3A and 3B which are component mounting targets are present in both of the transport lanes 2A and 2B, the alternating mounting processing section 37 executes the component mounting operation based on the alternating mounting using the upstream side operation areas 15A and 15B as standby areas and using the downstream side operation areas 16A and 16B as mounting areas (ST5: alternating mounting process). The transport situation determination process (ST3) is appropriately performed during the component mounting operation in the alternating mounting mode.

Next, the component mounting operations based on the independent mounting, the alternating mounting, and the one-side alternating mounting will be specifically described with reference to FIGS. 5A to 5C to FIGS. 7A to 7C. For ease of description, in FIGS. 5A to 5C to FIGS. 7A to 7C, the carry-in conveyors 10, the upstream side operation conveyors 11, the downstream side operation conveyors 12, the carry-out conveyors 13, the board detecting sensors S1 to S8, and the board holding mechanisms 18 are not shown. Further, among the boards 3A and 3B shown in FIGS. 5A to 5C to FIGS. 7A to 7C, boards that are not held by the board holding mechanisms 18 before component mounting are indicated by no marks, boards held by the board holding mechanisms 18 are indicated by diagonal lines, and boards after component mounting are indicated by oblique parallel lines. Further, in FIGS. 5A to 5C to FIGS. 7A to 7C, component mounting based on the first mounting head 8A is indicated by a white upward arrow, and component mounting based on the second mounting head 8B is indicated by a white downward arrow.

Figure 5A:
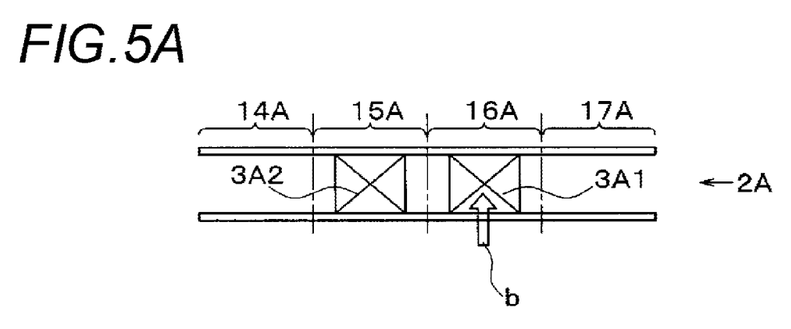
FIGS. 5A to 5C are diagrams illustrating a component mounting operation based on independent mounting in a component mounting apparatus according to an embodiment of the present invention.
Figure 5B:
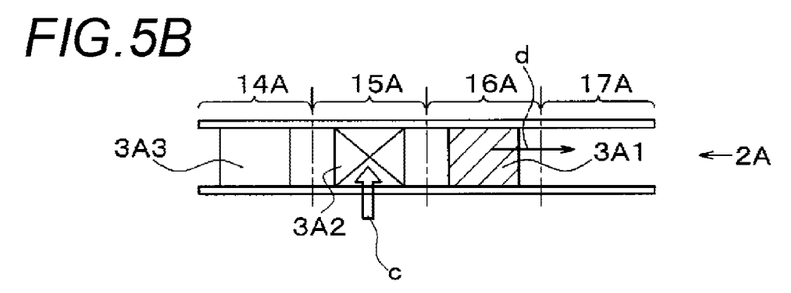
Figure 5C:
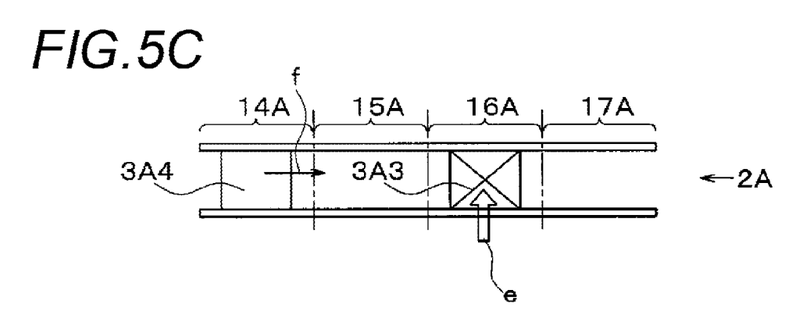

First, the component mounting operation based on the independent mounting controlled by the independent mounting processing section 36 will be described with reference to FIGS. 5A to 5C. In the independent mounting, the component mounting is independently performed in the first transport lane 2A and the second transport lane 2B. In FIG. 5, only the first transport lane 2A is shown, and the second transport lane 2B where the same component mounting is performed is not shown. In the independent mounting, both of the upstream side operation areas 15A and 15B and the downstream side operation areas 16A and 16B are used as mounting areas.

The independent mounting processing section 36 performs component mounting by the mounting head 8A with respect to a board 3A1 that is positioned and held (hereinafter, simply referred to as "held") at the downstream side operation area 16A (arrow b), and then, performs component mounting with respect to a board 3A2 that is held in the upstream side operation area 15A (arrow c). While the component mounting with respect to the board 3A2 is being performed, the independent mounting processing section 36 carries the board 3A1 where the component mounting is completed, which is transportable, to the carry-out area 17A (arrow d), and transports a board 3A3 which is the next component mounting target to the carry-in area 14A. When the component mounting with respect to the board 3A2 is completed, the independent mounting processing section 36 transports the board 3A3 to the downstream side operation area 16A to be held therein to perform the component mounting (arrow e), and transports a board 3A4 which is the next component target to the upstream side operation area 15A (arrow f) to be held therein (not shown in the figure).

In this way, in the independent mounting, subsequent to the component mounting in the downstream side operation areas 16A and 16B, the component mounting with respect to the boards 3A and 3B that are transported in advance to the upstream side operation areas 15A and 15B to be positioned and held therein is performed. Thus, it is possible to save time taken for transporting the boards 3A and 3B which are the next component mounting targets to be positioned and held, compared with a case where the component mounting operation is stopped after the component mounting in the downstream side operation areas 16A and 16B is completed, to thereby improve the productivity.

Figure 6A:
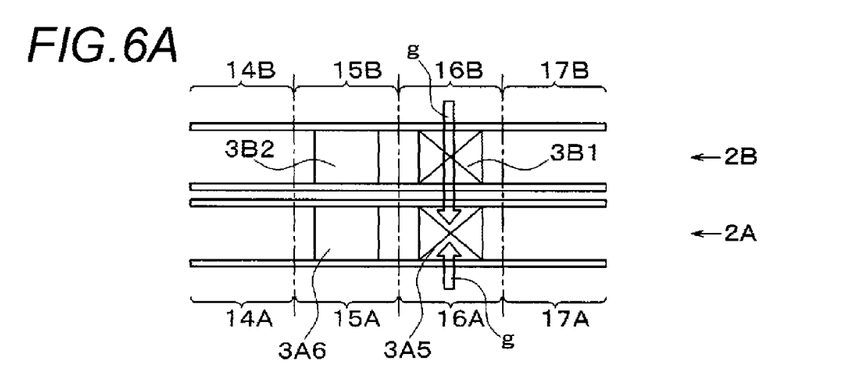
FIGS. 6A to 6C are diagrams illustrating a component mounting operation based on alternating mounting in a component mounting apparatus according to an embodiment of the present invention.
Figure 6B:
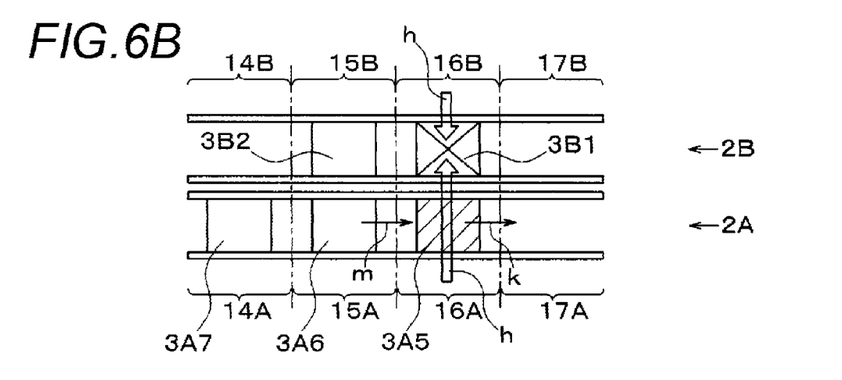
Figure 6C:
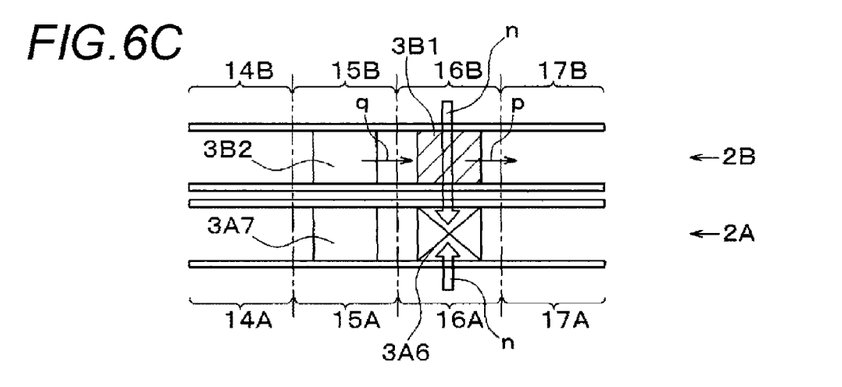

Next, the component mounting operation based on the alternating mounting controlled by the alternating mounting processing section 37 will be described with reference to FIGS. 6A to 6C. In the alternating mounting, the upstream side operation areas 15A and 15B are used as standby areas, and the downstream side operation areas 16A and 16B are used as mounting areas. In this example, it is assumed that a board 3A5 is transported to the downstream side operation area 16A earlier than a board 3B1.

The alternating mounting processing section 37 alternately performs component mounting by both of the mounting heads 8A and 8B with respect to the board 3A5 held in the downstream side operation area 16A (arrow g), and then, performs component mounting with respect to the board 3B1 held in the downstream side operation area 16B (arrow h). While the component mounting with respect to the board 3B1 is being performed, the alternating mounting processing section 37 carries the board 3A5 where the component mounting is completed to the carry-out area 17A (arrow k), and transports a board 3A6 which is the next component mounting target to the downstream side operation arrow 16A (arrow m) to be held therein. When the component mounting with respect to the board 3B1 is completed, the alternating mounting processing section 37 performs component mounting with respect to the board 3A6 held in the downstream side operation area 16A (arrow n), carries the board 3B1 where the component mounting is completed to the carry-out area 17B (arrow p), and transports a board 3B2 which is the next component mounting target to the downstream side operation area 16B (arrow q) to be held therein (not shown in the figure).

In this way, in the alternating mounting, during the component mounting in the downstream side operation area 16A or 16B in one transport lane, the board 3A or 3B which is the component mounting target in a standby state in the upstream side operation area 15A or 15B in the other transport lane is transported to the downstream side operation area 16A or 16B in the other transport lane to be positioned and held therein. Further, when the component mounting is completed in the downstream side operation area 16A or 16B in the one transport lane, the component mounting with respect to the board 3A or 3B held in the downstream side operation area 16A or 16B in the other transport lane is subsequently performed. Thus, the standby time for transporting the boards 3A and 3B is not generated.

Further, in the alternating mounting, since the board 3A or 3B that is in the standby state in the upstream side operation area 15A or 15B is not held by the board holding mechanism 18, it is possible to reduce the holding release time for transporting the board to the downstream side operation area 16A or 16B, to thereby reduce the transport time. Thus, during the component mounting in the downstream side operation area 16A or 16B in one transport lane, it is possible to complete the transport of the board 3A or 3B from the upstream side operation area 15A or 15B to the downstream side operation area 16A and 16B in the other transport lane. Further, as described above, as the mounting mode is switched so that the upstream side operation areas 15A and 15B are used as the mounting areas in the independent mounting and the upstream side operation areas 15A and 15B are used as the standby areas in the alternating mounting, it is possible to suppress reduction in productivity due to the production modes.

Figure 7A:
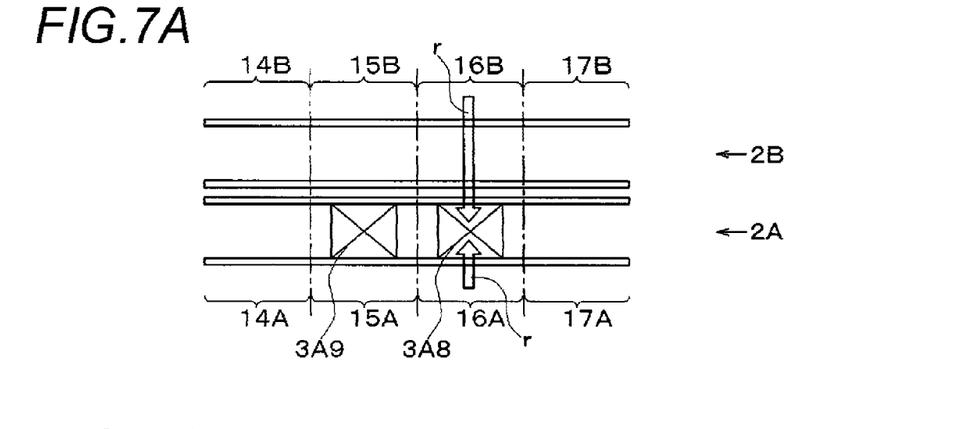
FIGS. 7A to 7C are diagrams illustrating a component mounting operation based on one-side alternating mounting in a component mounting apparatus according to an embodiment of the present invention.
Figure 7B:
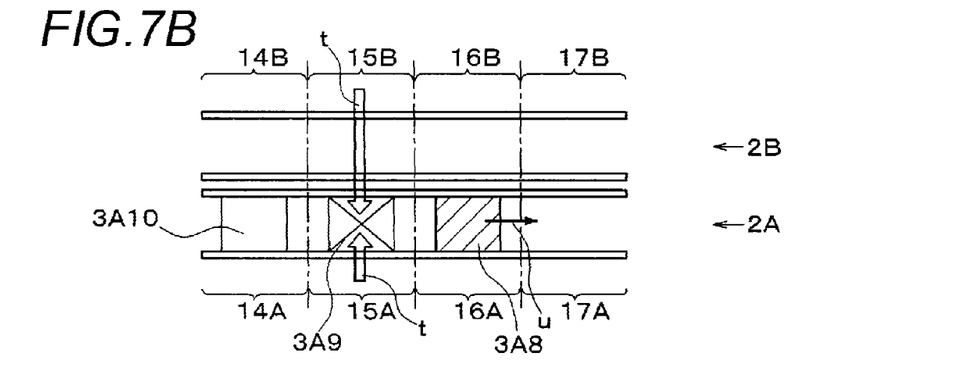
Figure 7C:
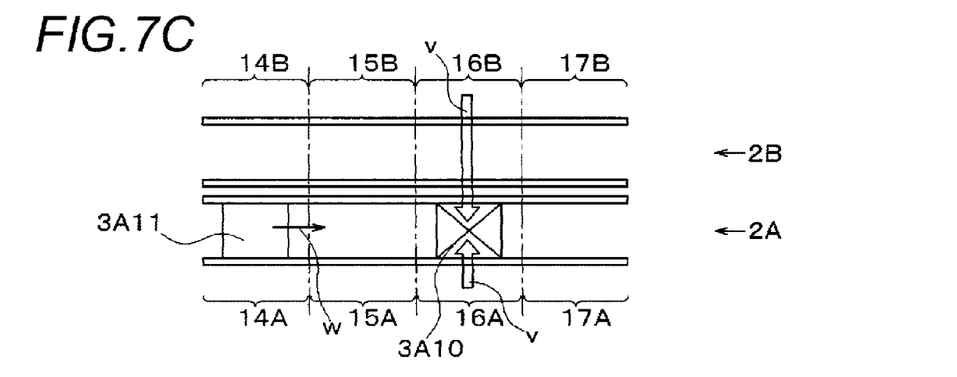

Next, the component mounting operation based on the one-side alternating mounting controlled by the one-side alternating mounting processing section 38 will be described with reference to FIGS. 7A to 7C. In the one-side alternating mounting, both of the upstream side operation areas 15A and 15B and the downstream side operation areas 16A and 16B are used as mounting areas. Further, the one-side alternating mounting is executed when the board 3A or 3B which is the component mounting target is not present in one of the transport lanes 2A and 2B in the alternating mounting. For example, when a component is mounted onto a front surface of a board in the first transport lane 2A and a component is mounted onto a rear surface of the board in the second transport lane 2B to manufacture a double-side mounted board on which components are mounted on both sides of the same board 3A or 3B in the alternating mounting, the one-side alternating mounting is executed immediately after the manufacturing is started and immediately before the manufacturing is finished.

That is, in the manufacturing of the double-side mounted board, the board 3A that is collected after the component mounting is completed on the front surface thereof in the first transport lane 2A is turned upside down, and is carried into the second transport lane 2B as the board 3B, so that the component mounting is performed on the rear surface. Thus, immediately after the manufacturing is started, the board 3B which is the component mounting target is not present in the second transport lane 2B, and the one-side alternating mounting is executed in the first transport lane 2A. Further, immediately before the manufacturing is completed, the component mounting with respect to the rear surface of the board is performed in the second transport lane 2B, but in the first transport lane 2A, the component mounting is completed and the board 3A which is the component mounting target is not present, and thus, the one-side alternating mounting is executed in the second transport lane 2B. In this example, similar to the time immediately after the manufacturing of the double-side mounted board is started, a case where the one-side alternating mounting is executed in the first transport lane 2A will be described.

The one-side alternating mounting processing section 38 alternately performs component mounting by the mounting heads 8A and 8B with respect to a board 3A8 that is held in the downstream side operation area 16A (arrow r), and then, performs component mounting with respect to a board 3A9 held in the upstream side operation area 15A (arrow t). While the component mounting with respect to the board 3A9 is being performed, the one-side alternating mounting processing section 38 carries the board 3A8 where the component mounting is completed to the carry-out area 17A (arrow u), and transports a board 3A10 which is the next component mounting target to the carry-in area 14A. If the component mounting with respect to the board 3A9 is completed, the one-side alternating mounting processing section 38 transports the board 3A10 to the downstream side operation area 16A to be held therein to perform the component mounting (arrow v), and transports a board 3A11 which is the next component target to the upstream side operation area 15A (arrow w) to be held therein (not shown in the figure).

In this way, in the one-side alternating mounting, subsequent to the component mounting in the downstream side operation area 16A or 16B in the transport lane 2A or 2B where the board 3A or 3B which is the component mounting target is present, the component mounting is performed with respect to the board 3A or 3B which is transported in advance to the upstream side operation area 15A or 15B to be positioned and held therein.

In the alternating mounting, when the upstream side operation areas 15A and 15B are used as standby areas even when the board 3A or 3B which is the component mounting target is not present in one of the transport lanes 2A and 2B, the following problem arises. That is, whenever the component mounting operation in the downstream side operation area 16A or 16B is completed, a standby time for carrying the board 3A or 3B that waits in the upstream side operation area 15A or 15B into the downstream side operation area 16A or 16B is generated. Thus, by switching the alternating mounting into the one-side alternating mounting in which the upstream side operation areas 15A and 15B are used as mounting areas, it is possible to reduce the standby time for carrying the boards 3A and 3B, to thereby improve the productivity.

As described above, in the component mounting apparatus 1 according to the embodiment of the present invention, it is determined whether the mounting mode is the independent mounting mode or the alternating mounting mode based on the mounting data 32. Further, when the transport situations of the transport lanes 2A and 2B are appropriately determined, and when the board 3A or 3B which is the component mounting target is not present in one of the transport lanes 2A and 2B in the alternating mounting, the one-side alternating mounting is selected. Further, whether to use the upstream side operation areas 15A and 15B as mounting areas or standby areas is selected by switching according to the selected mounting type, and then, the component mounting operation is performed.

As described above, in the alternating mounting, since whether to use the upstream side operation areas 15A and 15B as mounting areas or standby areas is selected by switching according to the transport situations of the transport lanes 2A and 2B to perform the component mounting operation, it is possible to reduce the standby time for carrying the boards 3A and 3B, to thereby improve the productivity.

According to the embodiments of the present invention, it may be possible to suppress reduction in productivity due to production modes in a component mounting apparatus that includes plural transport lanes, plural mounting heads, and plural operation areas, which is useful in a field where a component is mounted on a board to manufacture a component-mounted board.

What is claimed is:

1. A component mounting apparatus comprising:
   a first transport mechanism that is configured to transport a first board in a board transport direction;
   a second transport mechanism that is arranged with the first transport mechanism and is configured to transport a second board in the board transport direction;

wherein each of the first transport mechanism and the second transport mechanism includes an upstream side operation area where an upstream side board holding part for positioning the first board or the second board is provided, and a downstream side operation area where a downstream side board holding part that is provided on a downstream side in the board transport direction with reference to the upstream side operation area for positioning the first board or the second board is provided, a first component supply section that is disposed on a side of the first transport mechanism;

a second component supply section that is disposed on a side of the second transport mechanism;

a first mounting head that is configured to pick up components supplied from the first component supply section and mount the components onto the first board or the second board positioned at the upstream side operation area or the downstream side operation area;

a second mounting head that is configured to pick up components supplied from the second component supply section and mount the components onto the first board or the second board positioned at the upstream side operation area or the downstream side operation area; and a control unit that is configured to control the first transport mechanism, the second transport mechanism, the first component supply section, the second component supply section, the first mounting head, and the second mounting head based on mounting data, wherein the control unit comprises:

a mode determining section that is configured to determine whether the mounting data corresponds to an independent mounting mode in which the first mounting head is used to mount the components supplied from the first component supply section only onto the first board and the second mounting head is used to mount the components supplied from the second component supply section only onto the second board, or an alternating mounting mode in which the first mounting head and the second mounting head are used to mount the component supplied from the first component supply section and the second component supply section respectively onto either the first board or the second board followed by the first mounting head and the second mounting head mounting the components supplied from the first component supply section and the second component supply section respectively onto the other of the first board or the second board;

an independent mounting processing section that is configured to execute the independent mounting mode; and an alternating mounting processing section that is configured to execute the alternating mounting mode; and wherein when the mode determining section determines that the mounting data corresponds to the independent mounting mode the independent mounting processing section performs a control so that the upstream side operation area is used as a mounting area where the components supplied from the first component supply section are mounted onto the first board that is positioned by the upstream side board holding part and the components supplied from the second component supply section are mounted onto the second board that is positioned by the upstream side board holding part, when the mode determining section determines that the mounting data corresponds to the alternating mounting mode, the alternating mounting processing section performs a control so that the upstream side operation area is used as a standby area where the first board or the second board to be carried to the downstream side operation area temporarily waits and only the downstream side operation area is used as a mounting area where components supplied from the first component supply section and the second component supply section mechanism are mounted onto one of the first board and the second board that is positioned by the downstream side holding part.

2. The component mounting apparatus according to claim 1, wherein the mode determining section further determines whether the mounting data corresponds to a one-side alternating mounting mode in which only one of the first transport mechanism and the second transport mechanism is used for mounting and both of the first mounting head and the second mounting head are used to mount the components onto the first board or the second board of the first transport mechanism or the second transport mechanism that is used for mounting, and the control unit further comprises a one-side alternating mounting processing section that is configured to execute the one-side alternating mode, and the one-sided alternating mounting processing section performs a control so that the upstream side operation area of the transport mechanism of the first transport mechanism and the second transport mechanism that is used for mounting is used as a mounting area.

3. A component mounting method for mounting a component onto a board by a component mounting apparatus that includes a first transport mechanism that transports a first board in a board transport direction, a second transport mechanism that is arranged in parallel with the first transport mechanism and transports a second board in the board transport direction, wherein each of the first transport mechanism and the second transport mechanism includes an upstream side operation area where an upstream side board holding part for positioning the first board or the second board is provided, and a downstream side operation area where a downstream side board holding part that is provided on a downstream side in the board transport direction with reference to the upstream side operation area for positioning the first board or the second board is provided, a first component supply section that is disposed on a lateral side of the first transport mechanism, a second component supply section that is disposed on a lateral side of the second transport mechanism, a first mounting head that is configured to pick up components supplied from the first component supply section and mount the components onto the first board or the second board positioned at the upstream side operation area or the downstream side operation area, and a second mounting head that is configured to pick up components supplied from the second component supply section and mount the components onto the first board or the second board positioned at the upstream side operation area or the downstream side operation area, and controls the first transport mechanism, the second transport mechanism, the first component supply section, the second component supply section, the first mounting head, and the second mounting head based on mounting data, the method comprising:
determining whether the mounting data corresponds to an independent mounting mode for executing independent mounting in which the first mounting head is used to mount the components supplied from the first component supply section only onto the first board and the second mounting head is used to mount the components supplied from the second component supply section only onto the second board, or an alternating mounting mode for executing alternating mounting in which the first mounting head and the second mounting head are used to mount the component supplied from the first component supply section and the second component supply section respectively onto either the first board or the second board followed by the first mounting head and the second mounting head mounting the components supplied from the first component supply section and the second component supply section respectively onto the other of the first board or the second board, executing the independent mounting using the upstream side operation area as a mounting area where the components supplied from the first component supply section are mounted onto the first board that is positioned by the upstream side board holding part and the components supplied from the second component supply section are mounted onto the second board that is positioned by the upstream side board holding part when it is determined that the mounting data corresponds to the independent mounting mode; and executing the alternating mounting using the upstream side operation area as a standby area where the first board or the second board carried to the downstream side operation area temporarily waits when it is determined that the mounting data corresponds to the alternating mounting mode, and wherein when the mounting data corresponds to the alternating mounting mode, executing a control so that only the downstream side operation area is used as a mounting area where components supplied from the first component supply section and the second supply section are mounted onto one of the first board and the second board that is positioned by the downstream side holding part.

4. The component mounting method according to claim 3, further comprising: determining whether the mounting data corresponds to a one-side alternating mounting mode in which only one of the first transport mechanism and the second transport mechanism is used for mounting and both of the first mounting head and the second mounting head are used to mount the components onto the first board or the second board of the first transport mechanism or the second transport mechanism that is used for mounting, and using the upstream side operation area of the transport mechanism of the first transport mechanism and the second transport mechanism that is used for mounting as a mounting area.

* * * * *